United States Patent [19]

Wagner

[11] Patent Number: 4,586,000
[45] Date of Patent: Apr. 29, 1986

[54] TRANSFORMERLESS CURRENT BALANCED AMPLIFIER

[75] Inventor: Gary L. Wagner, Menlo Park, Calif.

[73] Assignee: Ford Aerospace & Communications Corporation, Detroit, Mich.

[21] Appl. No.: 621,014

[22] Filed: Jun. 15, 1984

Related U.S. Application Data

[63] Continuation-in-part of Ser. No. 347,744, Feb. 10, 1982, abandoned.

[51] Int. Cl.[4] .......................... H03F 3/45; H03F 3/16
[52] U.S. Cl. .................................. 330/252; 330/253; 330/300
[58] Field of Search ............... 330/252, 253, 254, 257, 330/261, 300, 301

[56] References Cited

U.S. PATENT DOCUMENTS 3,435,362  3/1969  Pamlenyi ............................. 330/254
3,676,789  7/1972  Bray .................................... 330/254
4,405,900  9/1983  van de Plassche ............. 330/253 X

OTHER PUBLICATIONS

*Microwave Filters and Circuits* (Academic Press, 1970), pp. 299–300.

Primary Examiner—Eugene R. LaRoche
Assistant Examiner—Steven J. Mottola
Attorney, Agent, or Firm—Edward J. Radlo; Robert D. Sanborn

[57] ABSTRACT

A current balanced linear amplifier which does not contain a transformer. A differential transistor pair (22, 32) forms the amplifying element, with at least one transistor (22 or 32) having an input signal (71, 72) applied to its base. A current sink (52) sinking a fixed value of current (I) is coupled to the commonly-coupled emitters of the transistor pair (22, 32). Coupled to the collector of each amplifying transistor (22, 32) is a self-biasing constant current source (2, 12) which produces a fixed amount of current (I/2) equal to one half the current (I) sunk by the current sink (52). Each self-biasing constant current source (2, 12) comprises a field effect transistor (2, 12) having a capacitor (6, 16) connected between the gate G and source S of the FET (2, 12) in a positive feedback arrangement. The balanced current output (61, 62) is taken from the collectors of each of the two amplifying transistors (22, 32).

1 Claim, 1 Drawing Figure

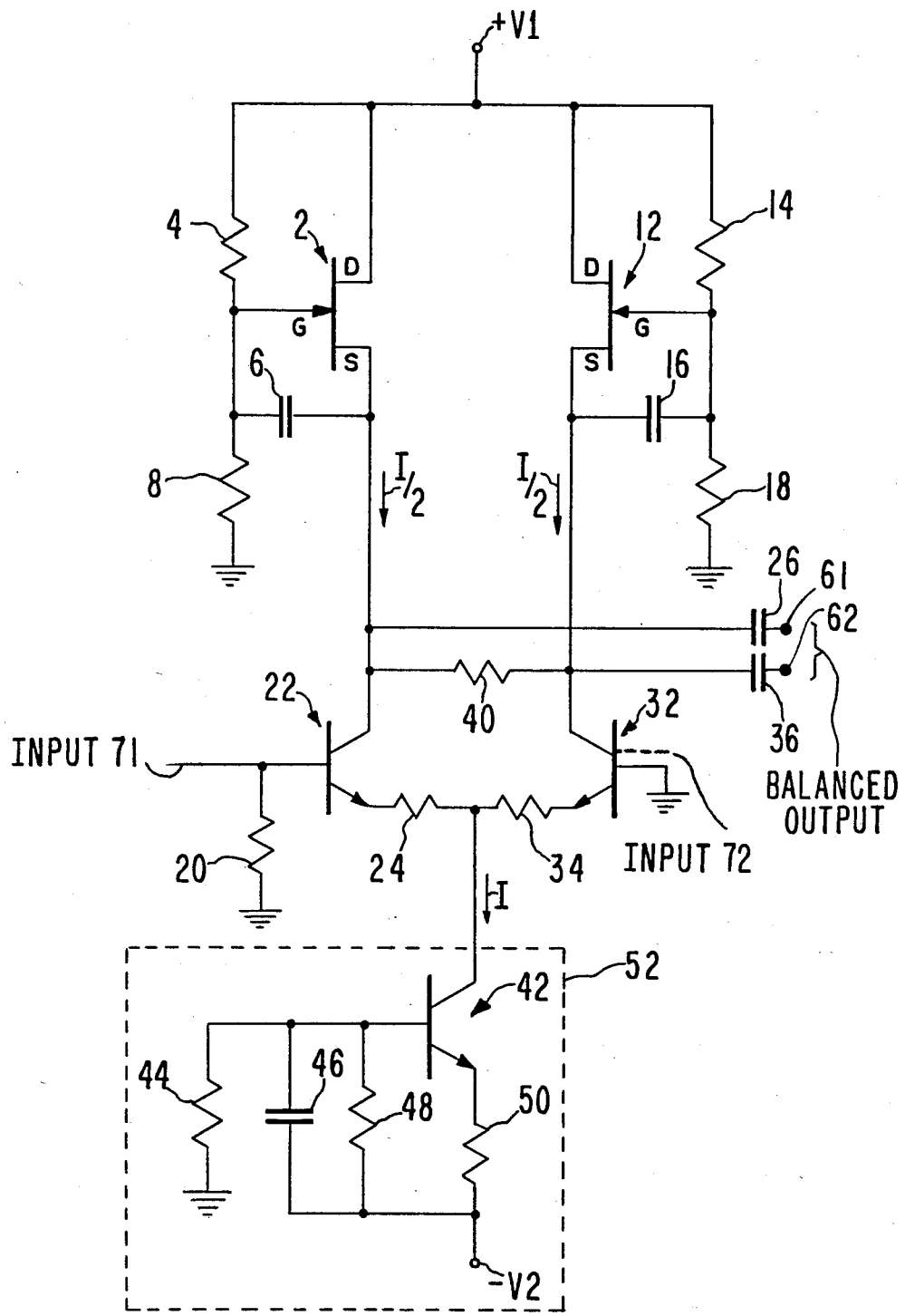

TRANSFORMERLESS CURRENT BALANCED AMPLIFIER

This application is a continuation-in-part of U.S. patent application Ser. No. 347,744, filed Feb. 10, 1982, now abandoned.

TECHNICAL FIELD

This invention pertains to the field of current balanced amplifiers (amplifiers having a current balanced output). By definition, a current balanced amplifier is an amplifier having the following characteristics: (1) a well defined output impedance; (2) two output terminals having currents 180° out of phase with respect to each other; and (3) a floating output, i.e., the voltage on one output terminal exists only in relation to the voltage on the other terminal and not in relation to ground or to any other arbitrary reference. Current balanced amplifiers are used in telephone and other communications systems.

BACKGROUND ART

A prior art search uncovered the following references:

*Microwave Filters and Circuits* (Academic Press, 1970), FIG. X.4.(b), p. 300, shows what is meant by a current balanced output. This reference teaches away from the instant transformerless current balanced amplifier in that it states; "An ideal [voltage or current] balun can only be approximated at low frequencies by a combination of ideal transformers."

U.S. Pat. No. 4,006,428 shows a detector circuit 156 comprising current sources 232 and 234 supplying transistors 216 and 218, respectively. However, the circuit is not a current balanced amplifier as in the present invention, because the presence of diodes 236 and 238, which drain off excessive current from the current sources, forces the output voltages of the circuit to be functions of fixed reference points. If this excess current were not removed, transistors 216 and 218 would saturate, and 232 and 234 would cease being current sources.

U.S. Pat. No. 4,061,932, while showing current sources supplying transistors, is a comparator operating in a saturated mode, and therefore is not a linear amplifier as in the present invention.

U.S. Pat. No. 3,644,838, while showing current sources supplying transistors, is not a current balanced amplifier as is the present invention.

U.S. Pat. Nos. 4,019,118 and 4,079,332 illustrate differential amplifiers, not current balanced amplifiers as in the present invention.

DISCLOSURE OF INVENTION

The advantages of current balanced amplifiers, as opposed to other types of amplifiers such as differential amplifiers, have been described in the literature. For example, a current balanced amplifier desirably permits common mode rejection. Such amplifiers are widely used in telephone and other communications systems. However, all current balanced amplifiers investigated utilize a transformer as an essential part of the amplifier circuit. The present invention is a current balanced amplifier not using a transformer, thereby reducing weight, cost, and size, and allowing for a greater bandwidth than is possible with a transformer. In the embodiment illustrated herein, the normal operating a.c. frequency range of the amplifier is from 30 Hz to approximately 40 MHz or 50 MHz.

The instant amplifier utilizes a differential transistor pair (22, 32) as an amplifier stage, to which are applied one or two possibly unbalanced inputs (71, 72), and from which are taken the two current balanced output terminal (61, 62) leads. A current sink (52) is coupled to the emitters of each of the amplifying transistors (22, 32). Each transistor (22, 32) is fed by an FET self-biasing constant current source (2, 12) having one half of the current value of the current sink (52). Each FET (2, 12) acts as a constant current source throughout the a.c. operating range of the amplifier, but not at d.c. and very low values of a.c., where it acts as a constant voltage source. This self-biasing feature prevents unwanted saturation of the amplifying transistors (22, 32) and insures linearity of the amplifier. Positive feedback (6, 16) is used in the source/gate circuit of each FET (2, 12) to achieve the desired constant current phenomenon at a.c.

BRIEF DESCRIPTION OF THE DRAWING

These and other more detailed and specific objects and features of the present invention are more fully disclosed in the following specification, reference being had to the accompanying drawing, in which the single drawing FIGURE is a circuit diagram of a preferred embodiment of the present invention.

BEST MODE FOR CARRYING OUT THE INVENTION

Transistors 22 and 32 are connected as a differential pair, i.e., their collectors are coupled together (via resistor 40) and their emitters are coupled together (via resistors 24 and 34). In the embodiment illustrated, transistors 22 and 32 are NPN transistors. If they were PNP transistors, all the polarities in the amplifier circuit would change, but the functioning of the circuit would not. That is, power supply V1 would be negative rather than positive, V2 would be positive rather than negative, FET's 2 and 12 would be P type rather than N type, and transistor 42 would be PNP rather than NPN. In an embodiment which has been built, transistors 22 and 32 are an MD2369 bipolar NPN transistor matched pair.

Resistors 24 and 34 set the gain for the amplifier and should be equal so as to preserve linearity. In the working embodiment, they are each 62 ohms.

Current sink 52 is coupled to the common connection point of resistors 24 and 34. Sink 52 serves to pull a fixed preselected value of current, here designated as I, from the emitters of the differential pair 22, 32. This current sink 52 can be implemented many different ways; the method illustrated in the FIGURE uses an emitter follower transistor 42, in this case as NPN 2N2219 bipolar transistor with its emitter connected through resistor 50 to a negative d.c. power supply voltage −V2. Connected in parallel between the base of transistor 42 and power supply −V2 are capacitor 46 and resistor 48. Additionally, resistor 44 is connected between the base of transistor 42 and ground. Resistances 44, 48, and 50 are selected to produce the desired value of I. Capacitor 46 serves to remove noise from the generated current I. In the working embodiment, capacitor 46 is 1.0 microfarads, resistor 44 is 2 kilohms, resistor 48 is 1 kilohm, and resistor 50 is 240 ohms.

One or two inputs 71, 72 are coupled to the differential pair 22, 32. In the embodiment illustrated in the FIGURE, a single unbalanced input 71 is coupled to the base of transistor 22. Resistor 20 is coupled between the same base and ground so as to elevate the voltage of this base above the collector voltage of sink transistor 42. The FIGURE illustrates the base of transistor 32 as grounded. Alternatively, one could utilize a second input 72 applied to the base of transistor 32, e.g., in the manner illustrated for the first input. Since input 72 is optional, it is shown as a dotted line in the FIGURE. If two inputs 71, 72 are used, they do not have to be balanced and do not have to be from a differential stage.

Load resistor 40 is connected between the collectors of transistors 22 and 32. The value of resistor 40 is selected to be the desired output impedance of the amplifier. Thus, resistor 40 enables satisfaction of the first part of the definition of a current balanced amplifier (given above under "Technical Field"). One current balanced output terminal 61 or 62 is coupled to the collector of one of transistors 22 and 32, via a first d.c. blocking capacitor 26 or 36, and the other output terminal 61 or 62 is coupled to the collector of the other transistor 22 or 32 via a second d.c. blocking capacitor 26 or 36. It matters not which output terminal 26 or 36 is coupled to which transistor 22 or 32. In the working model, the capacitance of each of 26 and 36 is a relatively high 4.7 microfarads, to provide a low frequency response for the amplifier.

The peak-to-peak output voltage of the amplifier, measured between the two current balanced output terminals 61, 62, is less than or equal to IR, where R is the resistance of resistor 40. I is chosen to be large enough to accommodate the required peak-to-peak output voltage and output impedance R.

The collector of each of transistors 22 and 32 is supplied with electrons from a separate self-biasing constant current source (2, 12), each source providing I/2 of current. The self-biasing constant current source for transistor 22 is denoted by the abbreviated notation 2 and consists of d.c. power supply $+V1$, resistors 4 and 8, capacitor 6, and FET 2. Similarly, the self-biasing constant current source for transistor 32 is denoted by the abbreviated notation 12 and consists of d.c. power supply $+V1$, resistors 14 and 18, capacitor 16, and FET 12.

The FET's 2, 12 should be of the same type, but don't have to be identical, because they are self-biasing. As used throughout this specification and claims, "self-biasing" means that each FET 2, 12 acts as a high impedance constant current source above a certain cutoff frequency that defines the low end of the normal operating a.c. frequency range of the amplifier, and acts as a low impedance constant voltage source below said cutoff frequency. In the working embodiment, 2N5486's, having a desired high impedance, were used for FET's 2, 12.

In an FET, the current flowing from its source S is a function of $V_{GS}$ (the gate/source voltage) only, as long as sufficient voltage is applied to its drain D. At a.c. frequencies within the normal operating frequency range of input signals 71, 72, $V_G$ (the gate G voltage of each FET 2, 12) follows $V_S$ (the source S voltage of the FET 2, 12) because of the presence of the feedback capacitor (6 or 16) creating a positive feedback loop (short circuit) in the gate/source circuit of the FET 2, 12. Since $V_G$ follows $V_S$, $V_{GS}$ does not change, and therefore, the current (I/2) flowing from the source S of the FET 2, 12 remains constant. This current is I/2 because of the symmetrical arrangement of the amplifying transistors 22, 32 and their constant current sources 2, 12. For these frequencies, the impedance looking into the source S of each FET 2, 12 is very large, and in particular is very much larger than R. Because the current sources 2, 12 produce unchanging currents I/2, the amplified current produced by the differential pair 22, 32 acting upon the input(s) 71, 72, is constrained to flow across load resistor 40. By definition, the sum of the currents $I_c22 + I_c32 = I$, where $I_c22$ and $I_c32$ are the currents flowing through the collectors of transistors 22 and 32, respectively. The current $I_{in}40$ into the left and (with respect to the FIGURE) of resistor 40 is:

$$I_{in}40 = I/2 - I_c22$$

The current $I_{out}40$ out of the right end of resistor 40 is:

$$I_{out}40 = -I/2 + I_c32 = I/2 - I_c22 = I_{in}40$$

Thus, the current driven into the output load at 61, 62 equals the current extracted from the output load at 61, 62, and therefore the second part of the definition of a current balanced amplifier is satisfied (see "Technical Field", above). The above expression governing the current through the output 61, 62 is not a function of resistance 40 and is not a function of any arbitrary reference voltage. Thus, the amplifier has in effect a floating output, satisfying the third part of the definition of a current balanced amplifier. If a second load resistor were connected from terminal 61 or 62 to ground, no voltage would be developed across it, since all current available is constrained to pass through resistor 40.

On the other hand, at d.c. (and a.c. frequencies below said cutoff frequency, as governed by the value of the feedback capacitors 6, 16), the current flowing from the source of each FET 2, 12 does change because $V_G$ is no longer constrained to follow $V_S$; therefore, the FET's 2, 12 no longer act as constant current sources at these frequencies, but rather become constant voltage sources, providing whatever bias current is required by transistors 22, 32. This self-biasing prevents undesirable saturation of transistors 22 and 32 at d.c. and thus preserves linearity of the amplifier. A d.c. analysis of the amplifier circuit shows that, by symmetry, with no input signals 71, 72 applied to transistors 22, 32, the current sinked by current sink 52 is equally split through transistors 22 and 32. When d.c. or low frequency a.c. input signals 71, 72 are applied, the two FET's 2, 12 act as constant voltage sources and therefore provide whatever current is required of them; at these frequencies, the currents flowing from the sources of FET's 2, 12 to the collectors of the corresponding transistors 22, 32 may very well be unequal.

In the working embodiment, resistors 4, 8, 14, and 18 are each 100 kilohms. Thus, voltage divider 4, 8 places a voltage of $+V\frac{1}{2}$ at the gate G of FET 2 and voltage divider 14, 18 places a voltage of $+V\frac{1}{2}$ at the gate G of FET 12. Capacitors 6 and 16 each have values of 1.0 microfarads, making 3 Hz the cutoff frequency above which the FET's 2, 12 act as constant current sources, and below which FET's 2, 12 act as constant voltage sources.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A transformerless current balanced linear amplifier for amplifying input signals, said amplifier operable over a wide a.c. frequency range of input signals and comprising:

first and second amplifying transistors connected as a differential pair, each transistor having a base, a collector, and an emitter, with at least one of said transistors having an input signal applied to its base;

first and second output terminals having a current balanced output therebetween, the collector of the first transistor being a.c. coupled to the first output terminal and the collector of the second transistor being a.c. coupled to the second output terminal;

a first self-biasing constant current source coupled to the collector of the first transistor; and a second self-biasing constant current source coupled to the collector of the second transistor;

wherein each self-biasing constant current source comprises a field effect transistor having a gate, a source, and a drain; and a capacitor connects together the gate and the source of each field effect transistor, whereby each self-biasing constant current source produces a fixed amount of current across the a.c. input signal frequency range of the amplifier, but acts as a constant voltage source for d.c. input signals.

* * * * *